(12) United States Patent
Lee

(10) Patent No.: US 7,097,479 B2
(45) Date of Patent: Aug. 29, 2006

(54) FPCB CONNECTION MECHANISM

(75) Inventor: In-Hwan Lee, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 233 days.

(21) Appl. No.: 10/627,806

(22) Filed: Jul. 28, 2003

(65) Prior Publication Data

US 2004/0038719 A1 Feb. 26, 2004

(30) Foreign Application Priority Data

Aug. 1, 2002 (KR) ............... 10-2002-0045661

(51) Int. Cl.
*H01R 3/00* (2006.01)
(52) U.S. Cl. .................................... 439/165
(58) Field of Classification Search ............... 439/165, 439/164
See application file for complete search history.

(56) References Cited

U.S. PATENT DOCUMENTS

| 3,860,312 | A |   | 1/1975  | Gordon, Jr. |        |
|-----------|---|---|---------|-------------|--------|
| 5,046,951 | A | * | 9/1991  | Suzuki      | 439/15 |
| 5,681,176 | A | * | 10/1997 | Ibaraki et al. | 439/165 |
| 5,727,960 | A | * | 3/1998  | Zehrung     | 439/165 |
| 5,833,476 | A | * | 11/1998 | Sakamaki    | 439/164 |
| 6,447,314 | B1| * | 9/2002  | Kato et al. | 439/165 |
| 6,547,575 | B1| * | 4/2003  | Kato et al. | 439/165 |

FOREIGN PATENT DOCUMENTS

| JP | 2000-231974 | 8/2000 |
| JP | 2002-118633 | 4/2002 |

OTHER PUBLICATIONS

Chinese Office Action dated Nov. 19, 2004.

* cited by examiner

*Primary Examiner*—Renee Luebke
*Assistant Examiner*—X. Chung-Trans
(74) *Attorney, Agent, or Firm*—Fleshner & Kim, LLP

(57) ABSTRACT

A flexible printed circuit board (FPCB) connection mechanism of the present invention includes a first connector which is connected to one end of a first FPCB and a second connector which rotatably coupled with the first connector and is connected to one end of a second FPCB. The FPCB connection mechanism of the present invention provides a mechanical and electrical connection between the main body and the cover body of the handset without twisting of two FPCBs that are respectively connected to the main PCB of the main body and the auxiliary PCB of the cover body so to avoid the physical damage of the FPCBs caused by frequent rotational movement of the cover body in relation to the main body and prevent the physical damages of FPCBs from changing the circuitry resistances or shorting the circuitry.

24 Claims, 4 Drawing Sheets

FPCB CONNECTION MECHANISM

BACKGROUND OF THE INVENTION

1. Field of the Invention

The present invention relates to a mobile handset and, in particular, to a flexible printed circuit board (FPCB) connection.

2. Background of the Related Art

Generally, a foldable type handset is composed of a main body including a printed circuit board (PCB) on which components for cooperatively driving a keypad, a microphone, and the handset are mounted, and a cover body including another PCB on which components for operating a speaker and display are mounted, the main body and cover body being pivotally connected by means of a hinge structure. The PCBs of the main body and the cover body are connected by a flexible printed circuit board (FPCB) in order to accommodate the movement of the hinge structure.

FIG. 1 is a perspective view illustrating a conventional foldable type handset. As shown in FIG. 1, a first PCB 130 of a main body 100 and a second PCB 160 of a cover body 150 are connected to each other by means of a FPCB 200. The FPCB 200 penetrates a space formed inside of the hinge supports 113, and a hinge shaft 154 of the cover body 150 is rotatably interposed between the hinge supports 113.

FIG. 2 is an enlarged view of the FPCB 200 of FIG. 1. The FPCB 200 comprises a main body connection part 201 which is plugged into the main body 100, a cover body connection part 202 which is plugged into the cover body 150, and a middle part 204 positioned between the main body connection part 201 and the cover body connection part 202 at a right angle so as to be parallel with the hinge shaft in order to minimize distortion of the FPCB when the hinge shaft rotates.

The FPCB 200 is provided with electrode pins 205 and 206 formed on respective ends of the main body connecting portion 201 and the cover connecting portion 202. The electrode pins 205 and 206 are inserted into slots formed on the first and second PCBs 130 and 160, respectively.

However, the FPCB as constructed in the foldable type handset described above has a drawback in that the middle part of the FPCB, which is positioned in the hinge mechanism, is likely to be damaged due to the twisting and bending stresses caused by the frequent pivoting motion of the cover body relative to the main body, resulting in a variation in resistance and shorting out the circuitry in the FPCB.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

An object of the present invention is to provide an FPCB connection mechanism capable of ensuring reliable signal transmission between the main body and the cover body. An object of the present invention is to provide an FPCB connection mechanism capable of preventing damage to the FPCB even in the event of frequent rotational movement of the cover body in relation to the main body.

To achieve this, the flexible printed circuit board (FPCB) connection mechanism of the present invention comprises a first connector which is connected to one end of a first FPCB and a second connector rotatably coupled to the first connector and connected to one end of a second FPCB.

Preferably, the first connector is fixedly installed on a first body and the second connector is fixedly installed on a second body. The first connector has a shape of a donut, providing a connecting hole, and the second connector has a cylindrical shape with a connecting protrusion corresponding to the connecting hole of the first connector, the connecting protrusion being rotatably inserted into the connecting hole.

The first connector includes a plurality of first electrodes arranged on an inner circumferential surface of the connecting hole and the second connector includes a plurality of second electrodes arranged on a surface of the connecting protrusion, the first and second electrodes contacting each other.

The first connector includes a first slot formed on an outer circumferential surface thereof for receiving an electrode pin formed at one end of the first FPCB and is electrically connected to the first electrodes.

The second connector includes a second slot formed on an outer circumferential surface thereof for receiving an electrode pin formed at one end of the second FPCB and is electrically connected to the second electrodes.

The present invention can be achieved in whole or in parts by a flexible printed circuit board (FPCB) connection mechanism configured to electrically connect two bodies of a foldable type handset, the FPCB connection mechanism, including, a first connector connected to one end of a first FPCB, and a second connector rotatably coupled to the first connector, wherein the second connector is configured to connect to one end of a second FPCB.

The present invention can be further achieved in whole or in parts by an FPCB connection mechanism, including, a first FPCB, a second FPCB, and a coupler configured to rotatably couple the first FPCB and the second FPCB, and configured to provide an electrical connection between the first FPCB and the second FPCB.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
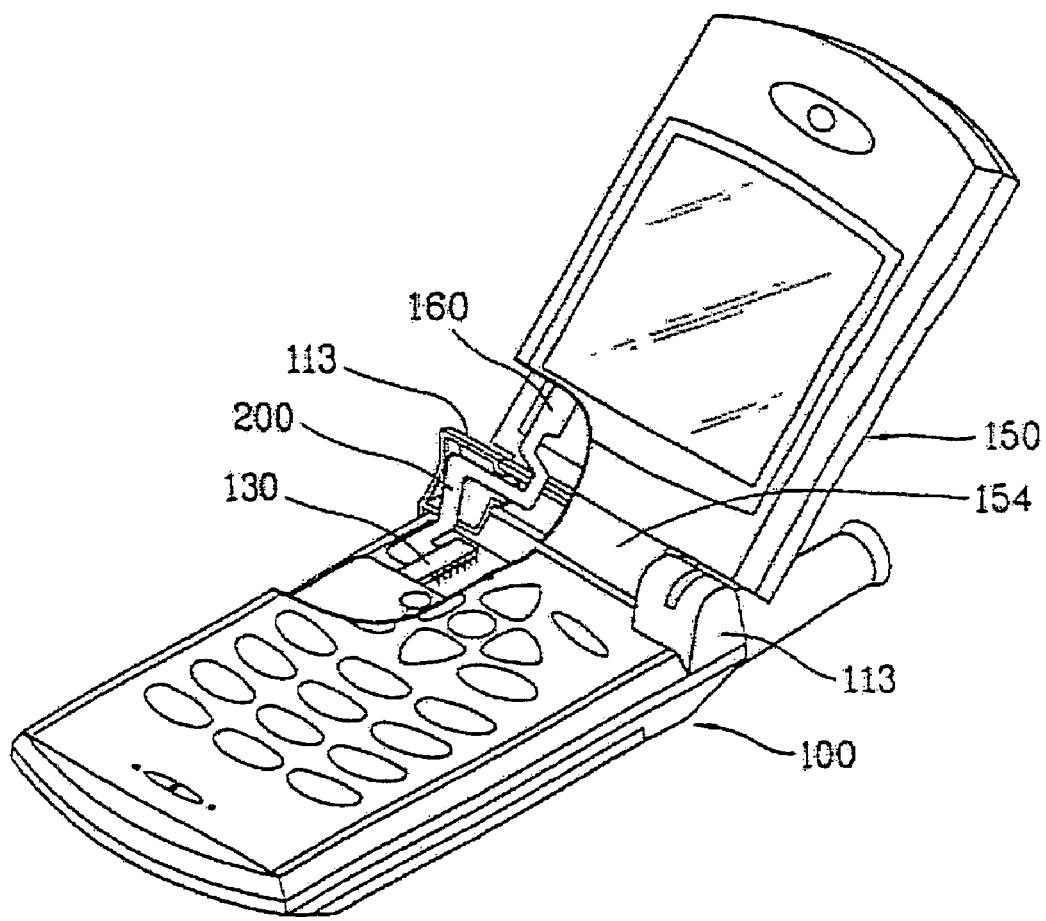
FIG. 1 is a perspective view of a conventional mobile handset.
Figure 2:
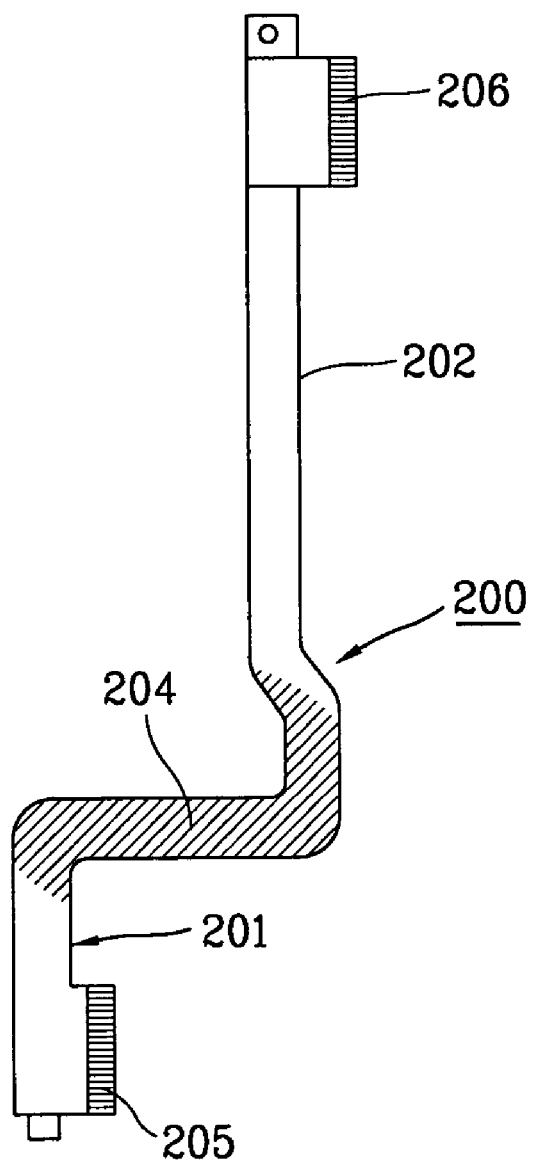
FIG. 2 is an enlarged view of an FPCB of the mobile handset of FIG. 1.
Figure 3:
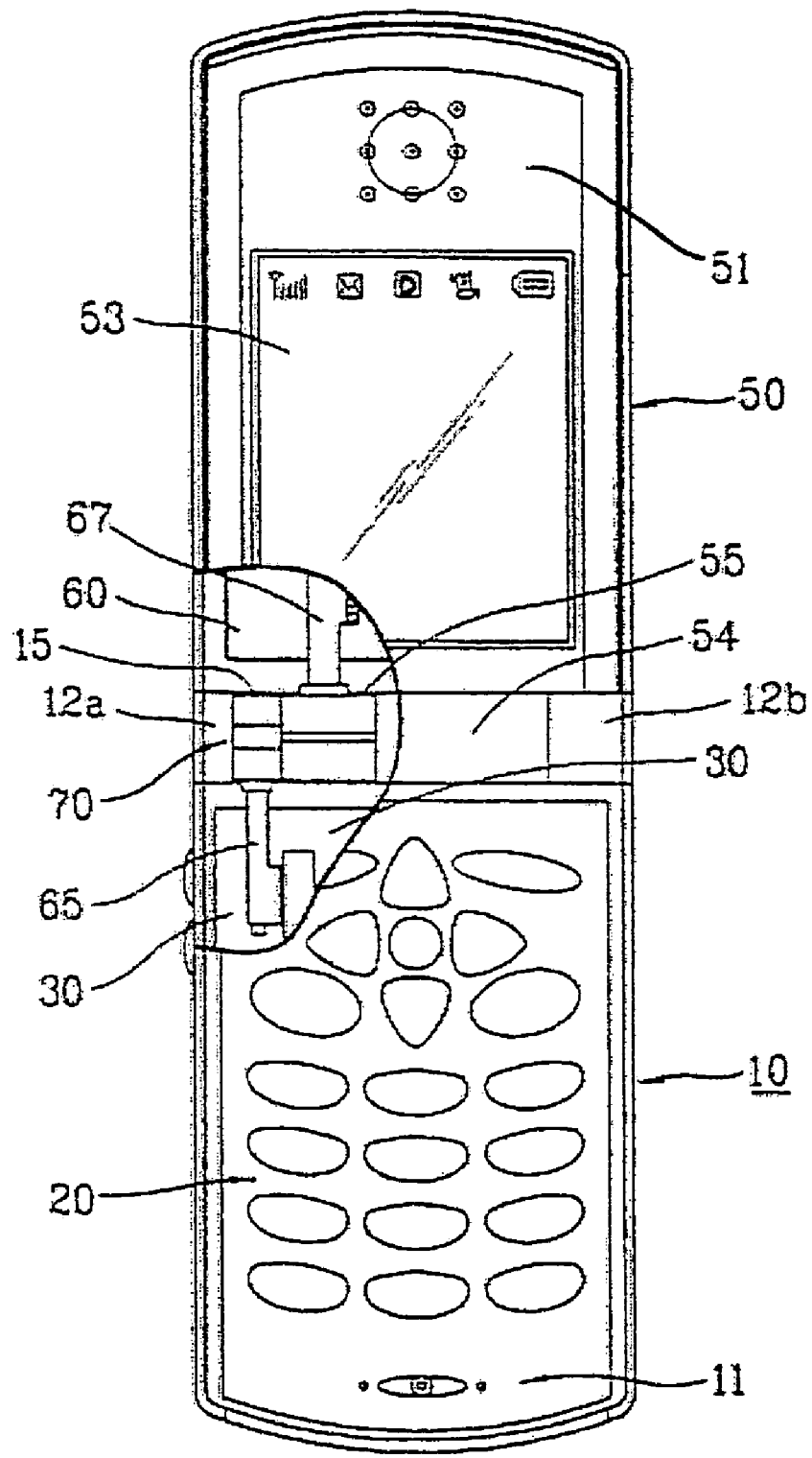
FIG. 3 is a partial cut view of an FPCB connection mechanism according to an embodiment of the present invention.

As shown in FIG. 3, the foldable type handset according to the present invention comprises a main body 10, a cover body 50 rotatably connected to the main body 10 by means of a hinge structure, and a flexible printed circuit board (FPCB) connection mechanism 70 for electrically connecting the main body 10 and the cover body 50.

The main body 10 includes a keypad 20 for manipulating the handset, a microphone 11 for inputting a voice signal, a main printed circuit board (PCB) 30 on which devices for operating the handset in cooperation with the keypad 20 and the microphone 11 are mounted, and a main body FPCB 65 which connects the main PCB to the FPCB connection mechanism 70. The cover body 50 includes a speaker 51 for outputting a voice signal, a display 53 for displaying various operation information of the handset, an auxiliary PCB 60 on which devices for operating the speaker 51 and display 53 are mounted, and a cover body FPCB 67 which connects the auxiliary PCB 60 to the FPCB connection mechanism 70.

The main body 10 is provided with a pair of supporting blocks 12a and 12b which protrude frontward at upper left and upper right ends of the main body 10, respectively. The first and second supporting blocks 12a and 12b are each provided with cylindrical openings 15 that are open in a direction facing each other.

The cover body 50 is provided with an extended portion 54 formed on a lower center part of the cover body 50 and interposed between the first and second supporting blocks 12a and 12b of the main body 10. The extended portion 54 is provided with a protrusion (not shown) formed at a right end thereof corresponding to the opening 15 of the second supporting block 12b, and an opening 55 formed at a left end thereof for receiving the FPCB connection mechanism 70.

Figure 4:
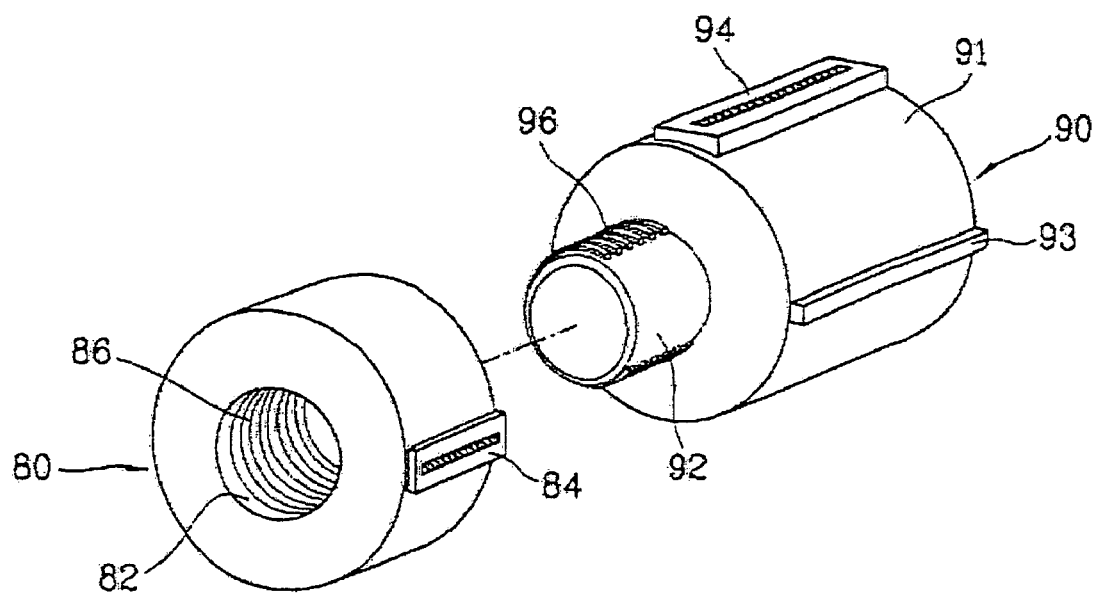
FIG. 4 is an exploded perspective view of the FPCB connection mechanism of FIG. 3.

Referring to FIG. 4, the FPCB connection mechanism 70 comprises a first connector 80 which is inserted into the opening 15 formed on the first supporting block 12a of the main body 10, and a second connector 90 which is inserted into the opening 55 formed on the extended portion 54 of the cover body 50.

The first connector 80 is formed in a substantially cylindrical, tubular shape. The first connector 80 has a connecting hole 82 formed at the center thereof, and a first slot 84 formed on the outer surface thereof, the first slot 84 formed in a direction parallel to the axis of the first connector 80, such that one end of the main body FPCB 65 is inserted into the first slot 84. A plurality of electrodes 86 are arranged on an inner circumferential surface of the connecting hole 82. The plurality of electrodes 86 are electrically connected to the first slot 84.

The second connector 90 includes a cylindrical body 91 having substantially the same radius as an outer radius of the first connector 80, and a connecting protrusion 92 formed along the same axis as that of the body 91 and having a smaller radius than that of the body 91. The body 91 is provided with a stator 93 formed on an outer surface of the body 91 in the axial direction of the cylindrical body 91 and a second slot 94 formed on the outer surface of the body 91. The second slot 94 is formed at a predetermined distance from and parallel to the stator 93, and connects to the cover body FPCB 67. The connecting protrusion 92 is provided with a plurality of electrodes 96 arranged in the circumferential direction on an outer circumferential surface thereof which are electrically connected to the second slot 94 inside the body 91.

The above structured first and second connectors 80 and 90 are rotatably coupled by inserting the connecting protrusion 92 of the second connector 90 into the connecting hole 82 of the first connector 80. The coupled first and second connectors 80 and 90 maintain electrical connection by the contact of the electrodes 96 formed on the connecting protrusion 92 and the electrodes 86 formed on a surface of the connecting hole 82.

The first connector 80 is fixedly inserted into the opening 15 of the first supporting block 12a and the second connector 90 is fixedly inserted into the opening 55 of the extended portion 54 while the first and second connectors 80 and 90 are rotatably engaged. The protruded portion (not shown) formed on the right end of the extended portion 54 is rotatably inserted into the opening 15 formed on the second supporting block 12b, thereby rotatably connecting the cover body 50 to the main body 10 while maintaining the electrical connection.

Figure 5:
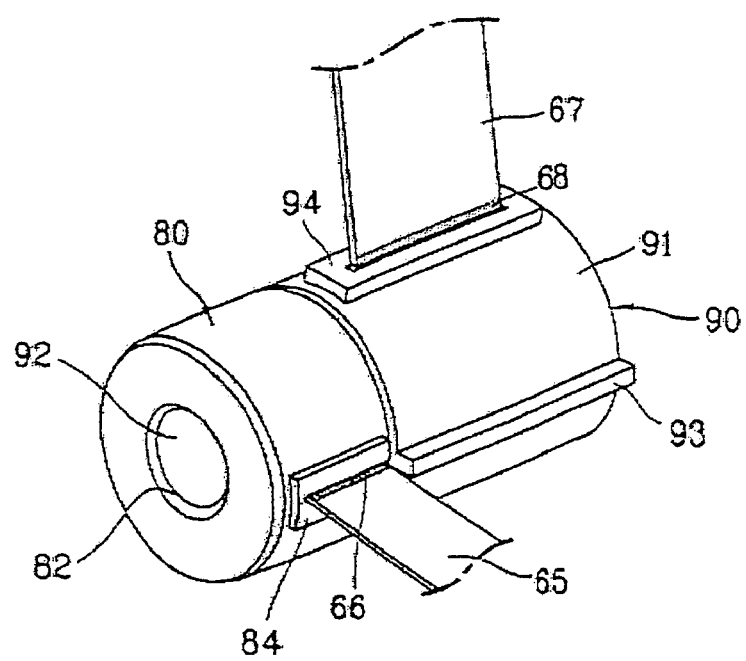
FIG. 5 is a perspective view of the FPCB connection mechanism of FIG. 4 when the FPCB connection mechanism is assembled.

Referring to FIG. 5, in order to connect the FPCB to the FPCB connection mechanism 70, a first electrode pin 66 formed on one end of the main body FPCB 65 is inserted into the first slot 84 of the first connector 80. The other end of the main body PCB 65 is connected to the main PCB 30 of the main body 10. A second electrode pin 68 formed on one end of the cover body FPCB 67 is inserted into the second slot 94 of the second connector 90. The other end of the cover body FPCB 67 is connected to the auxiliary PCB 60 of the cover body 50.

The operation of the above structured FPCB connection mechanism according to the present invention will now be described. When a foldable type handset employing the FPCB connection mechanism 70 is unfolded by rotating the cover body 50, the second connector 90 of the FPCB connection mechanism 70 is rotated in conjunction with the cover body 50. At this time, the connecting protrusion 92 of the second connector 90 is rotated in the connecting hole 82 of the first connector 80, the first connector 80 being fixedly inserted in the first supporting block 12a while the electrode 96 formed on the connecting protrusion 92 of the second connector 90 maintains the electrical connection with the electrode 86 formed on a surface of the connecting hole 82 of the first connector 80.

As described above, the FPCB connection mechanism for the foldable type handset of the present invention provides both a mechanical and an electrical connection between the main body and the cover body of the handset without twisting the two FPCBs that are respectively connected to the main PCB of the main body and the auxiliary PCB of the cover body. Thus, it is possible to avoid physical damage to the FPCBs caused by frequent rotational movement of the cover body in relation to the main body.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A flexible printed circuit board (FPCB) connection mechanism configured to electrically connect two bodies of a foldable type handset, the FPCB connection mechanism comprising:

a first connector installed on a first body and connected to one end of a first FPCB of the first body; and a second connector installed on a second body and configured to connect to one end of a second FPCB of the second body, wherein the first connector is configured to rotate relative to the second connector as the first body is rotated relative to the second body, while the first and second FPCBs connected respectively thereto are configured to remain in substantially fixed positions within the first and second bodies.

2. The mechanism of claim 1, wherein the first connector is formed in a substantially cylindrical shape with a connecting hole formed in the longitudinal direction thereof, and wherein the second connector comprises a connecting protrusion formed in a substantially cylindrical shape configured to correspond to the connecting hole of the first connector, wherein the connecting protrusion is configured to be rotatably inserted into the connecting hole.

3. The mechanism of claim 2, wherein the first connector further comprises a plurality of first electrodes arranged on an inner circumferential surface of the connecting hole, and wherein the second connector further comprises a plurality of second electrodes arranged on an outer circumferential surface of the connecting protrusion, and wherein the plurality of first and second electrodes are configured to contact each other when the first connector and the second connector are coupled.

4. The mechanism of claim 3, wherein the first connector further comprises a first slot formed on an outer circumferential surface thereof, said first slot configured to receive an electrode pin formed extended at one end of the first FPCB.

5. The mechanism of claim 4, wherein the first slot is configured to be electrically connected to the plurality of first electrodes.

6. The mechanism of claim 5, wherein the second connector further comprises a second slot formed on an outer circumferential surface thereof, said second slot configured to receive an electrode pin formed extended at one end of the second FPCB.

7. The mechanism of claim 6, wherein the second slot is configured to be electrically connected to the plurality of second electrodes.

8. The mechanism of claim 3, wherein the second connector further comprises a second slot formed on an outer circumferential surface thereof, said second slot configured to receive an electrode pin formed extended at one end of the second FPCB.

9. The mechanism of claim 8, wherein the second slot is configured to be electrically connected to the plurality of second electrodes.

10. A flexible printed circuit board (FPBC) connection mechanism, comprising:

a first FPCB configured to be installed on a first body;

a second FPCB configured to be installed on a second body; and a coupler configured to couple the first FPCB and the second FPCB, wherein the coupler comprises a first connector configured to connect to one end of the first FPCB, and a second connector rotatably coupled to the first connector, wherein the second connector is configured to connect to one end of the second FPCB, and wherein the first and second FPCBs remain in substantially fixed positions within the first and second bodies as the first and second bodies, and the first and second connectors, are rotated relative to one another, respectively.

11. The mechanism of claim 10, and wherein the coupler is further configured to rotatably couple the first and second FPCBs, to provide an electrical connection between the first and second FPCBs, and to maintain an electrical connection between the first FPCB and the second FPCB when the first body and the second body are rotated relative to one another.

12. The mechanism of claim 11, wherein the first connector is formed in a substantially cylindrical shape with a connecting hole formed in the longitudinal direction thereof, and wherein the second connector comprises a connecting protrusion configured to be rotatably inserted into the connecting hole of the first connector.

13. The mechanism of claim 12, wherein the connecting protrusion is formed in a substantially cylindrical shape configured to correspond to the connecting hole of the first connector.

14. The mechanism of claim 12, wherein the first connector further comprises a plurality of first electrodes arranged on an inner circumferential surface of the connecting hole, and the second connector further comprises a plurality of second electrodes arranged on an outer circumferential surface of the connecting protrusion, and wherein the plurality of first electrodes and plurality of second electrodes are configured to contact each other when the first connector and the second connector are coupled.

15. The mechanism of claim 14, wherein the first connector further comprises a first slot formed on an outer circumferential surface thereof, said first slot configured to receive a first electrode pin formed at one end of the first FPCB.

16. The mechanism of claim 15, wherein the first slot is configured to form an electrical connection with the plurality of first electrodes.

17. The mechanism of claim 14, wherein the second connector further comprises a second slot formed on an outer circumferential surface thereof, said second slot configured to receive a second electrode pin formed at one end of the second FPCB.

18. The mechanism of claim 17, wherein the second slot is configured to form an electrical connection with the plurality of second electrodes.

19. An apparatus, comprising:

a first body having a first electronic circuitry;

a second body having a second electronic circuitry; and a coupler that couples the first body and the second body such that at least one of the first and second bodies are rotatable around the coupler, wherein the coupler includes:

a first connector connected to one end of a first flexible printed circuit board (FPCB) installed on the first body;

a second connector rotatably coupled to the first connector, wherein the second connector is connected to one end of a second FPCB installed on the second body; and an electrical connector unit configured to couple the first and second electronic circuitries such that a substantially constant position of the first and second electronic circuitries is maintained in the first and second bodies, respectively.

20. The apparatus of claim 19, wherein the coupler is configured to maintain an electrical connection between the first FPCB and the second FPCB when the first body and the second body are rotated relative to one another.

21. The apparatus of claim 20, wherein the first connector is formed in a substantially cylindrical shape with a connecting hole formed in the longitudinal direction thereof, and the second connector comprises a connecting protrusion formed in a substantially cylindrical shape corresponding to the connecting hole of the first connector, wherein the connecting protrusion is rotatably inserted into the connecting hole.

22. The apparatus of claim 21, wherein the first connector further comprises a plurality of first electrodes arranged on an inner circumferential surface of the connecting hole, and the second connector further comprises a plurality of second electrodes arranged on an outer surface of the connecting protrusion, wherein the plurality of first electrodes and the plurality of second electrodes contact each other when the first connector and the second connector are coupled.

23. The apparatus of claim 22, wherein the first connector further comprises a first slot formed on an outer circumferential surface thereof, said first slot configured to receive a first electrode pin formed at one end of the first FPCB, and to form an electrical connection with the plurality of first electrodes.

24. The apparatus of claim 22, wherein the second connector further comprises a second slot formed on an outer circumferential surface thereof, said second slot configured to receive a second electrode pin formed at one end of the second FPCB, and to form an electrical connection with the plurality of second electrodes.

* * * * *